United States Patent [19]

Menick

[11] Patent Number: 4,595,927
[45] Date of Patent: Jun. 17, 1986

[54] LORAN C CYCLE SLIP REDUCTION TECHNIQUE

[75] Inventor: Ralph E. Menick, Euless, Tex.

[73] Assignee: Motorola, Inc., Schaumburg, Ill.

[21] Appl. No.: 628,052

[22] Filed: Jul. 5, 1984

[51] Int. Cl.$^4$ .................................................. G01S 1/24
[52] U.S. Cl. .................................... 343/390; 343/389; 343/7 PL; 328/155
[58] Field of Search ...................... 343/389, 390, 7 PL, 343/392; 455/264, 316; 328/155; 364/452

[56] References Cited

U.S. PATENT DOCUMENTS 3,774,210  11/1973  Mollod et al. .
3,816,831   6/1974  Mollod .
3,858,216  12/1974  DeVaul .
3,916,320  10/1975  Roll et al. .
3,921,076  11/1975  Currie .................................. 343/390
3,934,254   1/1976  Vogeler et al. .

Primary Examiner—Theodore M. Blum
Attorney, Agent, or Firm—F. John Motsinger; Edward M. Roney; James W. Gillman

[57] ABSTRACT

In accordance with the present invention, there is provided a Loran C cycle slip reduction technique that consists of sensing the signal to noise ratio and narrowing the phase locked loop bandwidth when a predetermined signal-to-noise threshold is exceeded.

6 Claims, 5 Drawing Figures

LORAN C CYCLE SLIP REDUCTION TECHNIQUE

THE FIELD OF INVENTION

The invention disclosed herein is concerned with high signal-to-noise phase tracking.

More particularly, this invention relates to land-mobile Loran C phase tracking through cycle slip reduction.

BACKGROUND OF THE INVENTION

Loran-C, an acronym for Long Range Navigation, is a low frequency (100 kHz) system originally intended to provide navigation capability to marine craft operating in the coastal confluence of the continental United States and on the Great Lakes. Because of the low frequency of the Loran-C transmitters and their very high output power (0.5 million watts), the signals also cover over three-quarters of the land area of the United States and, more importantly, more than 90 percent of the population living in metropolitan areas. Thus, Loran-C also is being employed in the avionics market where it is used as a navigational aid by fixed-wing aircraft and helicopters.

In marine applications, a Loran-C receiver on a vessel makes the measurements of the Loran-C signals transmitted from at least three geographic locations. By applying standard trilateration techniques, combined with a knowledge of the location of the relevant transmitters, the Loran-C receiver can compute values to determine the latitude and longitude of the vessel.

In avionics applications, the computation of location is almost identical.

Over the sea and high in the air, Loran-C signals propagate freely. However, land-mobile applications have two significant differences.

The need for this invention arose from a problem in that the structures, including bridges, normally found in a metropolitan environment tend to cause rapid amplitude and phase variations (fading) in the Loran-C signals. When the signal to noise ratio is quite high, a rapid phase variation and a rapid amplitude reduction will often cause cycle slippage. That is, the phase locked loop will attempt to track the phase excursion and may slip to an adjacent cycle, instead. Accordingly, location errors ensue.

This result is a characteristic of phase locked loops when used in a hard limited receiver. Specifically, the phase locked loop bandwidth increases with increasing signal-to-noise.

The instant invention solves the problem by decreasing the phase locked loop (PLL) bandwidth to degrade the ability of the PLL to track rapid phase excursions.

This invention represents a significant advance over the prior art and over this technical field by providing a Loran-C cycle slip reduction technique that consists of decreasing the phase locked loop (PLL) bandwidth to degrade the ability of the PLL to track rapid phase excursions.

BRIEF SUMMARY OF THE INVENTION

It is the object of the present invention to provide a Loran-C cycle slip reduction technique that consists of decreasing the phase locked loop (PLL) bandwidth to degrade the ability of the PLL to track rapid phase excursions.

It is a further object of the invention to provide a Loran-C receiver suitable for the land-mobile market.

Yet another object of the present invention is to provide a Loran-C receiver capable of remaining locked to the proper phase cycle in a dynamic, rapid fading, high signal to noise environment.

A final object of the invention is to provide an Automatic Vehicle Location system capable of improved positional accuracy in such an environment.

The ultimate object is to provide a Loran-C cycle slip reduction technique that consists of decreasing the phase locked loop (PLL) bandwidth to degrade the ability of the PLL to track rapid phase excursions.

In accordance with the present invention, there is provided a Loran-C cycle slip reduction technique that consists of sensing the signal to noise ratio and narrowing the phase locked loop bandwidth when a predetermined signal-to-noise threshold is exceeded.

Thus there has been provided a Loran-C cycle slip reduction technique that consists of decreasing the phase locked loop (PLL) bandwidth to degrade the ability of the PLL to track rapid phase excursions.

BRIEF DESCRIPTION OF THE DRAWINGS

Additional objects feature, and advantages, in accordance with the present invention, will be more clearly understood by way of unrestricted example from the following detailed description, taken together with the accompanying drawings, in which.

The invention will be readily appreciated by reference to the detailed description when considered in conjunction with the accompanying drawings in which like reference numerals designate like parts throughout the Figures.

THE DESCRIPTION OF THE PREFERRED EMBODIMENT

It has been recognized that a patentable invention may lie in the discovery of the source of a problem without regard to the difficulty, or lack thereof, of the solution. Such considerations are part of considering the subject matter as a whole.

Problems arose in attempting to apply Loran-C technology to the land-mobile environment.

Figure 1:
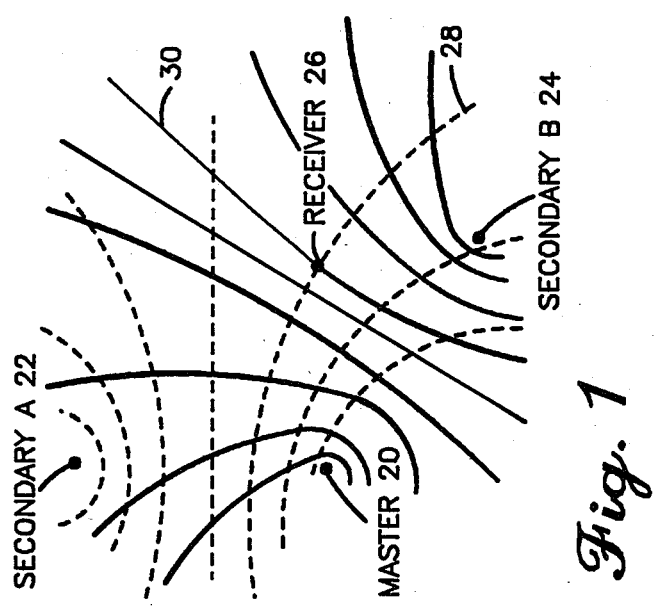
FIG. 1 is a diagram illustrating the principles of Loran navigation.

Radio navigational systems for determining a hyperbolic line of position are well known in the marine and aeronautic arts, but not in the land-mobile art. In systems such as conventional Loran-C systems, a line of position (FIG. 1) is determined by measuring, at the receiver 26, the difference in travel time of two pulsed radio signals (FIGS. 2 and 3) which are transmitted from two known, widely spaced locations. Knowing the velocity of radio waves, the difference in travel time can be converted to a difference in distance from the two known locations. The difference in distance determines the hyperbolic line of position (FIG. 1). One system often employed for radio navigation purposes is the Loran-C system (FIG. 1). A typical Loran-C chain of transmitting stations (20, 22 and 24) includes a master station 20 and first 22 and second 24 secondary stations, each of which transmits a plurality of radio frequency pulses at preselected times relative to each other (FIG. 2).

Figure 2:
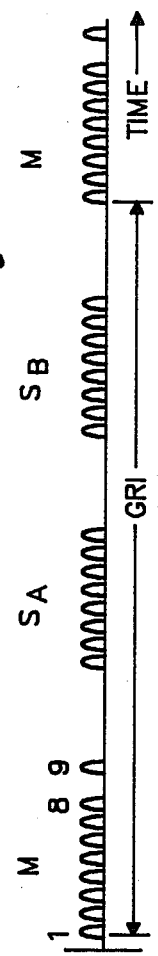
FIG. 2 is a graphical illustration of the time-phase relationship between the master and secondary Loran-C pulse transmissions.

As shown in FIG. 2, the master M and first $S_A$ and second $S_B$ secondary stations each transmit a pulse group during a period of time designated the group repetition interval (GRI). More specifically, the master station first transmits a sequence of eight radio frequency pulses designated M and numbered 1 through 8, such pulses being generated at one millisecond intervals and being followed by a ninth pulse often employed for manual identification of the master station signal. The first secondary station 22 generates a pulse group of eight radio frequency pulses, designated $S_A$, a predetermined amount of time after pulse group transmission by the master station 20. A second secondary station 24 transmits yet another pulse group of eight radio frequency pulses, designated $S_B$, a predetermined amount of time after transmission of the first secondary $S_A$ pulse group. The times at which the master M and first $S_A$ and second $S_B$ secondary station pulse groups are transmitted in each GRI are selected such that the times at which the pulse groups are received at the Loran-C receiver 26 do not overlap in time. This sequence of pulse group transmissions (M, $S_A$ and $S_B$) first by the master station 20 followed by the first 22 and second 24 secondary stations continues ad infinitum over successive GRI's.

To determine the location of a remote Loran-C receiver 26, the time difference (TD) between the time of arrival of the first secondary station 22 pulse groups $S_A$ and the master station 20 pulse groups M is determined and employed to plot a hyperbolic line of position 28 on an appropriate map (FIG. 1). The time difference (TD) between the time of arrival of the second secondary station 24 pulse groups $S_B$ and the master station 20 pulse groups M at the Loran-C receiver 26 is determined and used to plot a second hyperbolic line of position 30 intersecting with the first line of position 28 thus yielding the location of the Loran-C receiver 26.

Figure 3:
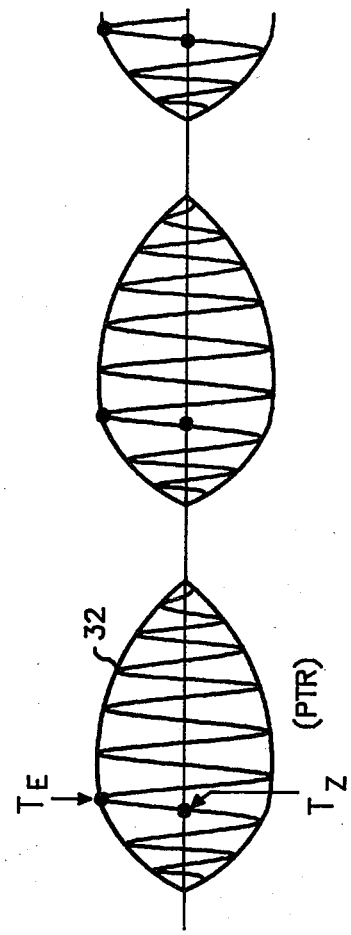
FIG. 3 is a graphical illustration of the time-phase relationship between the Loran-C pulse envelope and the tracking cycles.

FIG. 3 is an enlarged representation of some of the pulses (M, $S_A$ or $S_B$) of FIG. 2. The envelope 32 of the pulse is readily seen in this view.

To determine time differences, a Loran-C receiver 26 typically locks to the third positive-going zero crossing $T_Z$ of the carrier of each of the pulses of the pulse group (M, $S_A$ and $S_B$) transmitted by each of the master 20 and secondary stations (22 and 24), respectively. Such zero crossing $T_Z$ is known as a pulse tracking reference point or PTR. To derive the location of a Loran-C receiver 26, the times at which the third positive zero crossings $T_Z$ of the pulses of the pulse groups (M, $S_A$ and $S_B$) of the master 20 and secondary stations (22 and 24) occur are accurately monitored. The third zero crossing $T_Z$ is employed as a convenient pulse tracking reference point (PTR) although other zero crossings may be employed as reference points. The Loran-C receiver 26 determines the time difference (TD) between the time of the reception of the PTR of the master station 20 with respect to the first secondary station 22 thus yielding one hyperbolic line of position 28. The receiver 26 additionally determines the time difference between the PTR of the received master station 20 pulse groups M and the PTR of the second received secondary station 24 pulse groups $S_B$ thus yielding a second hyperbolic line of position 30. The intersection of the lines of position indicates the site 26 of the Loran-C receiver 26.

A receiver is provided for automatically measuring the time intervals between the pulses produced by the Loran transmitting system in which the phase of the radio frequency cycles produced by the master 20 and secondary stations (22 and 24) are synchronized with each other. Moreover, the transmitters (20, 22 and 24) provide a fixed predetermined phase relationship between the R.F. cycles and the pulse envelopes 32.

This invention is a Loran-C cycle slip reduction technique that is specifically designed to operate in the land mobile environment. Marine and aviation receivers operate at an atmospheric noise level and in a signal environment wherein signal level is a slowly varying parameter, determined only by distance from Loran-C transmitters.

This receiver, which embodies the instant invention, operates in an urban signal environment that is characterized by dynamic signal changes due to buildings, tunnels, bridges and the other similar structures which are often encountered only in land-mobile operations. A Loran-C land-mobile receiver often must operate in a harsh receiving environment. That is, undesired extraneous radio frequency signals may be present near or in the passband of the Loran-C receiver (typically 90–110 kHz). There are several other environmental difficulties.

Pulse distortion is much worse in the land-mobile environment that is where prior receivers were designed to operate. This makes Loran-C pulse cycle selection and phase tracking more difficult. Power lines and other local interferers also cause tracking problems and ensuing location errors. These interferers are notched out with fix-tuned notches in prior receivers, but are handled with adaptive interference cancellors in this system because they are of random frequency and amplitude on land.

When a vehicle equipped with a LORAN-C receiver passes under a structure such as a bridge, the received LORAN-C signals fade in amplitude. Along with this amplitude fade, the signals may also undergo significant phase distortions. If the phase excursions are fast enough, a cycle slip can occur. Cycle slips occur when the phase tracking point of the phase-locked loop (PLL) for a given LORAN-C station rapidly slips off of the proper phase tracking reference (PTR) point and relocks to an adjacent positive zero crossing one carrier cycle away. The cycle slips are due to strong perturbations of the received pulse waveform by local anomalies such as power lines and railroad tracks, not commonly experienced in Loran C marine receivers, but commonly experienced in the land-mobile environment.

In those cases where the received signal is very strong (e.g., SNR greater than 20 dB ), a rapid phase variation and a rapid amplitude reduction will often cause cycle slippage. That is, the phase locked loop will attempt to track the phase excursion and may slip to an adjacent cycle, instead. This result is a characteristic of phase locked loops when used in a hard limited receiver. Specifically, the phase locked loop bandwidth increases with increasing signal-to-noise. As a result, the receiver will attempt to track the phase excursions. Accordingly, location errors ensue.

The exact mechanism of the process is not completely understood, but vehicular dynamics and direction of travel with respect to the anomaly's orientation, signal strength, noise level and PLL parameters all play a part as conditions which may give rise to a slip. This situation will generally not occur when the received SNR is less than 20 dB. Field test data has indicated that cycle slips occur almost exclusively on stations with very high (+20 dB or greater) SNR's.

This fact is surprising, yet, in retrospect, not startling since, during these rapid cycle-slips, the PLL must be *driven* off of its normal zero-crossing and does not simply "drift" off and re-lock. As SNR increases, the bandwidth of the PLL increases resulting in improved transient response. Thus, the loop is able to track the rapid phase excursions near a local anomaly and, in combination with rapidly changing amplitude, is susceptible to being driven off onto another zero-crossing. These cycle slips could take tens of minutes to correct and might go entirely undetected by a motorist without extrenal reference and would cause location errors of on the order of a mile in major metropolitan areas. Clearly, a land-mobile Automatic Vehicle Location System utilizing Loran C with location errors on the order of a mile for minutes is unacceptable.

Figure 4:
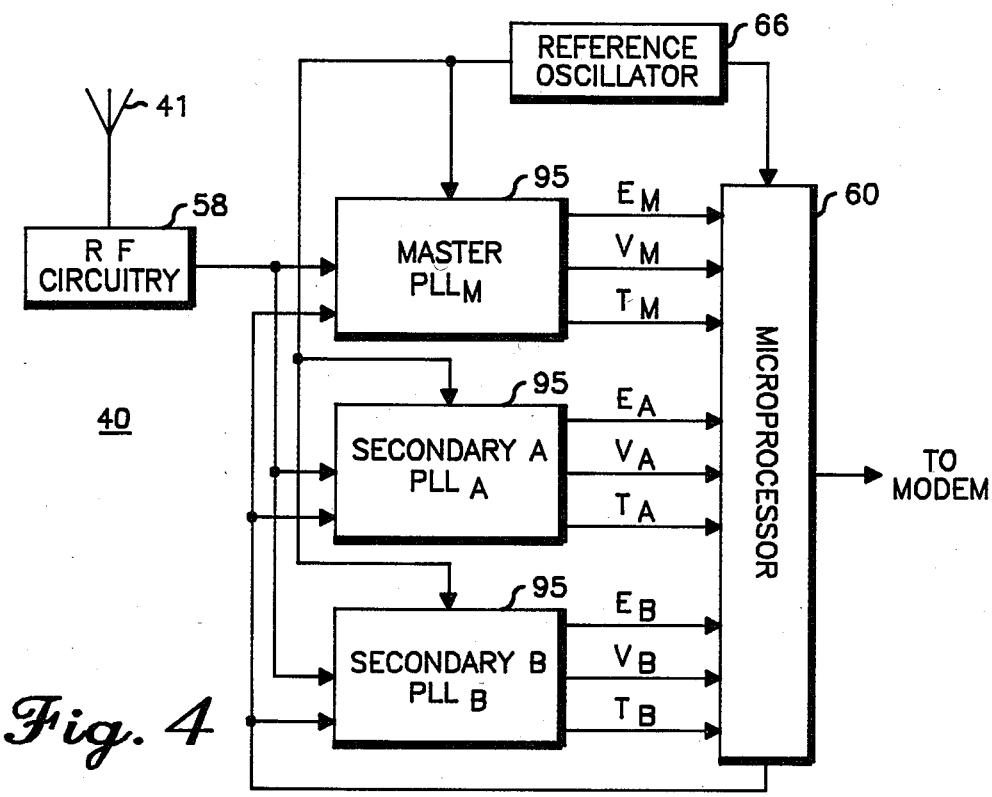
FIG. 4 is a block diagram of a Loran receiver according to the instant invention.

FIG. 4 illustrates an apparatus for reducing cycle slip which incorporates the preferred embodiment of the present invention.

One approach, then, to reduce the incidence of cycle slipping is to reduce the transient performance of a PLL 95 that is tracking a strong signal. A way to do this is to modify the PLL parameters of the loop that is tracking the signal. The loop's $w_n$ could purposefully be reduced so that its tracking ability was degraded. The degradation would be small enough to keep from throwing away too much tracking accuracy (and aggravating location error), but large enough to keep the tracking point PTR from being driven onto another zero-crossing. This change in parameters could be made a "DIP-switch" programmable option to the LORAN-C receiver if it is known that it will be operating in an area where a station has a high SNR, or it can be done adaptively to a station whose estimated SNR falls above a certain threshold as measured by the receiver itself. Likewise in this case, the PLL parameters could be switched back to "normal" when the station's estimated SNR falls below the threshold. Based on current field test data, this threshold would probably be in the +15 dB to +20 dB SNR range.

Figure 5:
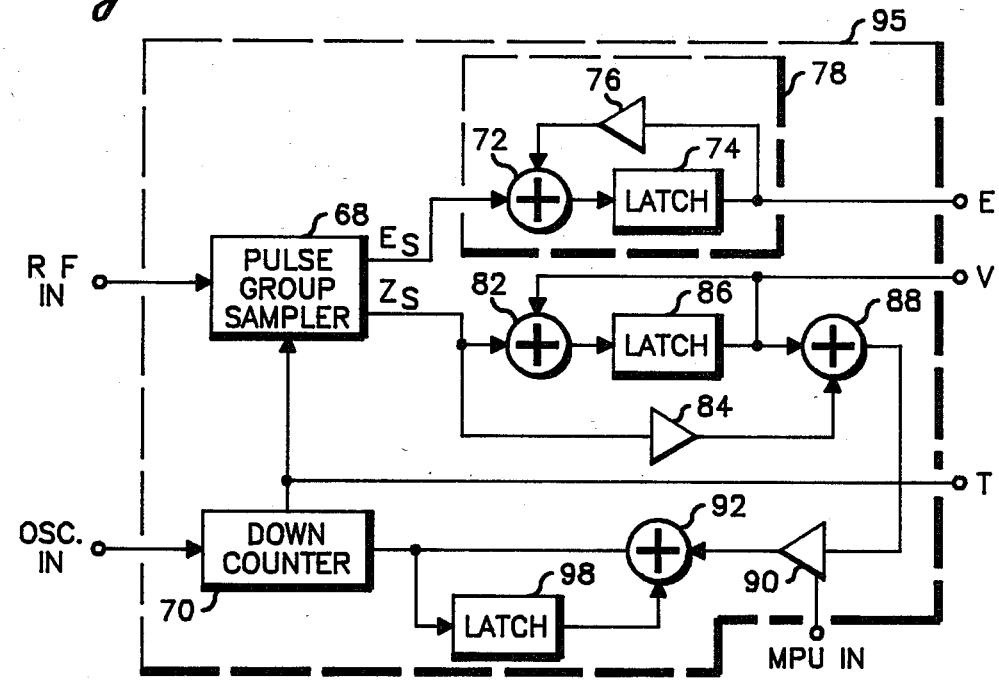
FIG. 5 is a block diagram of the pulse tracking phase locked loops.

A second-order phase-locked loop PLL is shown in FIG. 5. It consists of a pulse group sampler 68, latches, adders, multipliers, and a down-counter 70. The RF signal coupled into the pulse group sampler 68 is sampled at times $T_Z$ and $T_E$ as shown in FIG. 3. The time at which to sample is determined from the down-counter 70. The samples taken at times $T_Z$ and $T_E$ are coupled from the pulse group sampler 68 from separate outputs $Z_S$ and $E_S$, respectively. The sample time $T_Z$ is usually referred to as the pulse tracking reference or PTR. The $E_S$ output of the pulse group sampler is coupled to an adder 72. The output of the adder 72 is coupled to a latch 74 and the output of the latch is coupled to a multiplier 76 having a positive gain less than unity. The output value from the latch 74 is multiplied 76 and this value is then coupled to the other input of the adder 72. These three elements digitally perform the function of a lowpass filter 78. The output of this lowpass filter 78 is designated E. E is proportional to the average signal-to-noise ratio of the received Loran-C signal being tracked by the phase-locked loop (PLL) 95.

The second output of the pulsed group sampler $Z_S$ is coupled to the input of an adder 82 and the input of a multiplier 84. The output of the adder 82 is coupled to the input of a latch 86. The output of the latch 86 is coupled to the input of a second adder 88 and also coupled to the second input of the first adder 82. The output of the multiplier 84 is coupled to the second input of the second adder 88. The output of the second adder 88 is coupled to the input of the multiplier 90 and the output of this multiplier 90 is coupled to the input of a third adder 92. The output of this adder 92 is coupled to the input of a down-counter 70 and a latch 98. The output of the latch 98 is coupled to the second input of the adder 92. This arrangement is commonly referred to as a second order phase-locked loop. The implementation illustrated in FIG. 5 is digital in nature.

The number stored in the first latch 86 is proportional to the receiver's velocity toward or away from the particular Loran-C transmitter being tracked by the phase locked loop PLL. This information, designated V, is output from the phase locked loop PLL.

The numbers stored in the second latch 98 plus the output of the multiplier 90 represents the number of oscillator cycles required between the current sample and the next sample. This number is loaded into the down counter 70. Since the down-counter is clocked by the oscillator 66, when the down counter 70 reaches zero it is the appropriate time to take the next sample. Therefore, when the down-counter 70 reaches zero, a sample command is coupled from the down counter 70 to the input of the pulse group sampler 68. In addition, this sample event is output from the phase-locked loop (PLL) as the sample time and is designated T.

For simplicity, what has been described is the operation of the pulse group sampler 68 as it relates to one Loran-C pulse. In actual practice, the Loran-C transmitters sequentially emit a group of eight pulses with exactly one millisecond between each succeeding pulse. The pulse group sampler 68 actually samples at times $T_Z$ ms, $T_Z+1$ ms, $T_Z+2$ ms, . . . $T_Z+7$ ms and $T_E$ ms, $T_E+1$ ms, $T_E+2$ ms, . . . $T_E+7$ ms. Therefore, the output of the pulse group sampler 68 represents an accumulation of these samples.

Returning to FIG. 4, T, V, and E are coupled from the output of their respective phase-locked loops 95 to the appropriate inputs of the microprocessor 60. The microprocessor 60 takes the sample time inputs ($T_M$, $T_A$ & $T_B$) together with its internal time base from the oscillator 66 and calculates time difference between the master and secondary A and time difference between the master and secondary B as follows:

$$TD_A = T_M' - T_A'$$

$$TD_B = T_M' - T_B'$$

where the T' are the actual numerical values of time that inputs T couple into the microprocessor 60.

The microprocessor 60 checks the values $E_M$, $E_A$, and $E_B$ to see if any of them exceeds a threshold $E_T$. If any of the values exceed the SNR threshold, the microprocessor 60 adapts the PLL circuitry appropriately to decrease the phase locked loop (PLL) bandwidth to degrade the ability of the PLL to track rapid phase excursions. More specifically, the loop bandwidth is narrowed by decreasing the gain of multiplier 90 which reduces the speed at which phase excursions can be tracked. When the value falls below the SNR threshold again, the PLL circuitry is returned to its original state.

Thus, there has been provided a Loran C cycle slip reduction technique that consists of decreasing the phase locked loop (PLL) bandwidth to degrade the ability of the PLL to track rapid phase excursions.

Further, there has been provided a Loran C receiver suitable for the land-mobile market, a Loran C receiver capable of remaining locked to the proper phase cycle in a dynamic, rapid fading, high signal to noise environment, and an Automatic Vehicle Location system capable of improved positional accuracy in such an environment.

It will be appreciated by those skilled in the art that other signal identifying patterns or means may be used with corresponding modification of equipment, without departing from the scope of the invention. Further, this invention is applicable for improved phase tracking in high signal to noise environments where slippage from cycle to cycle is a problem. All of the functions shown can be performed by analog apparatus as well as by digital apparatus or software, or by a combination of all three. Hence, the apparatus contemplated by the procedure is not particularly limited to digital apparatus. However, in view of the requirements of an operable Loran receiver, the speed of operation, and space and cost considerations, the functions are most practically carried out by digital apparatus and software. The structural embodiment of the present invention described herein is made of digital apparatus and represents the best known use of the invention.

The foregoing description of the various embodiments are merely illustrative of the broad inventive concept comprehended by the invention and has been given for clarity of understanding by way of unrestricted example. However, it is not intended to cover all changes and modifications which do not constitute departures from the spirit and scope of the invention.

What I claim and desire to secure by Letters Patent is:

1. A technique for reducing cycle slip in a rapid fading, high signal-to-noise environment in a phase locked loop having a bandwidth comprising the steps of:
   sensing the signal-to-noise relationship; and
   narrowing the phase locked loop bandwidth when said signal-to-noise relationship exceeds a predetermined threshold,
   whereby decreasing the phase locked loop bandwidth degrades the ability of the phase locked loop to track rapid phase excursions.

2. A technique for reducing cycle slip in a rapid fading, high signal-to-noise environment, in a Loran-C receiver, in a phase locked loop having a bandwidth comprising the steps of:
   sensing the signal-to-noise relationship; and
   narrowing the phase locked loop bandwidth when said signal-to-noise relationship exceeds a predetermined threshold,
   whereby decreasing the phase locked loop bandwidth degrades the ability of the phase locked loop to track rapid phase excursions.

3. A technique for reducing cycle slip as claimed in claim 1 or 2, wherein said bandwidth narrowing step further comprises:
   decreasing the phase locked loop tracking speed.

4. An apparatus for reducing cycle slip in a rapid fading, high signal-to-noise environment in a phase locked loop having a bandwidth comprising:
   means for sensing the signal-to-noise relationship; and
   means for narrowing the phase locked loop bandwidth when said signal-to-noise relationship exceeds a predetermined threshold,
   whereby decreasing the phase locked loop bandwidth degrades the ability of the phase locked loop to track rapid phase excursions.

5. An apparatus for reducing cycle slip in a rapid fading, high signal-to-noise environment, in a Loran-C receiver, in a phase locked loop having a bandwidth comprising:
   means for sensing the signal-to-noise relationship; and
   means for narrowing the phase locked loop bandwidth when said signal-to-noise relationship exceeds a predetermined threshold,
   whereby decreasing the phase locked loop bandwidth degrades the ability of the phase locked loop to track rapid phase excursions.

6. An apparatus for reducing cycle slip as claimed in claim 4 or 5 wherein said bandwidth narrowing means further comprises:
   means for decreasing the phase locked loop tracking speed.

* * * * *